(12) United States Patent
Carle et al.

(10) Patent No.: US 10,175,870 B1
(45) Date of Patent: Jan. 8, 2019

(54) PROTOTYPING APPARATUS WITH CONFIGURABLE PINS AND CORRESPONDING METHODS

(71) Applicant: Marvell International Ltd., Hamilton (BM)

(72) Inventors: Andrew Jacob Carle, San Jose, CA (US); Khin Zaw, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 452 days.

(21) Appl. No.: 14/924,283

(22) Filed: Oct. 27, 2015

Related U.S. Application Data

(60) Provisional application No. 62/079,297, filed on Nov. 13, 2014.

(51) Int. Cl.
*G06F 17/50* (2006.01)
*G06F 3/0484* (2013.01)
*G06F 3/0482* (2013.01)
*H05K 5/00* (2006.01)

(52) U.S. Cl.
CPC ........ *G06F 3/04847* (2013.01); *G06F 3/0482* (2013.01); *G06F 3/04842* (2013.01); *H05K 5/0017* (2013.01); *H05K 5/0026* (2013.01)

(58) Field of Classification Search
USPC .................................................. 716/13–139
See application file for complete search history.

(56) References Cited

U.S. PATENT DOCUMENTS

| | | | | |
|---|---|---|---|---|
| 2006/0041854 A1* | 2/2006 | Schlanger | ................ | G06F 8/60 717/101 |
| 2007/0136453 A1* | 6/2007 | Ewing | ...................... | G06F 1/26 709/223 |

\* cited by examiner

*Primary Examiner* — Binh Tat

(57) ABSTRACT

A prototyping apparatus includes a housing, a microcontroller within the housing, a user interface on an exterior surface of the housing for interaction between a user and the microcontroller, and a first connector, exposed in a first slot in the housing, having a first plurality of pins for accepting a first external component. Via the user interface, the microcontroller presents a first plurality of configuration choices for the first plurality of pins, and accepts user selections from among the first plurality of choices. The prototyping apparatus may further include a second connector exposed in a first slot in the housing, having a second plurality of pins for accepting a second external component, in which case, via the user interface, the microcontroller presents a second plurality of configuration choices for the second plurality of pins, and accepts user selections from among the second plurality of configuration choices.

11 Claims, 3 Drawing Sheets

PROTOTYPING APPARATUS WITH CONFIGURABLE PINS AND CORRESPONDING METHODS

CROSS REFERENCE TO RELATED APPLICATION

This disclosure claims the benefit of commonly-assigned U.S. Provisional Patent Application No. 62/079,297, filed Nov. 13, 2014, which is hereby incorporated by reference herein in its entirety.

FIELD OF USE

This disclosure relates to prototyping systems of the type having a microcontroller and a user interface, which is used with external sensors or transducers or other input/output components provided in a form factor having a standard physical pin arrangement but whose pin assignments vary. More particularly, this disclosure relates to such a prototyping system having assignable pins.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

In the prototyping of small devices, including, but not limited to, for example, devices that may be connected to the "Internet-of-Things," it has become common for some components (such as sensors, transducers or indicators) to be provided on a small-form-factor circuit board known as a "breakout board." A breakout board includes a group of input/output terminal pins in a standard physical layout, but with pin assignments that vary according to the component on the breakout board. The breakout board may be plugged into a breadboard, from which jumper wires may be used to connect the breakout board terminals to the rest of a circuit, including, in many cases, a microcontroller. However, a prototype built using a breadboard with jumper wires may be unwieldy. Moreover, if the jumper wires become dislodged, the prototype may be damaged or, at the very least, may require substantial effort to restore.

SUMMARY

A prototyping apparatus includes a housing, a microcontroller within the housing, a user interface on an exterior surface of the housing for interaction between a user and the microcontroller, and a first connector having a first plurality of pins for accepting a first external component. The housing has a first slot therein exposing the first connector. The microcontroller presents via the user interface a first plurality of configuration choices for the first plurality of pins. The microcontroller accepts via the user interface user selections from among the first plurality of choices.

The prototyping apparatus may further include a second connector having a second plurality of pins for accepting a second external component, in which case the housing has a second slot therein exposing the second connector, the microcontroller presents via the user interface a second plurality of configuration choices for the second plurality of pins, and the microcontroller accepts via the user interface user selections from among the second plurality of configuration choices.

A method of operating such a prototyping apparatus may include presenting, by the microcontroller, via the user interface, a first plurality of configuration choices for the first plurality of pins, and accepting, by the microcontroller, via the user interface, user selections from among the first plurality of choices.

A prototyping system for prototyping devices, where each device to be prototyped includes a microcontroller and a component, includes a plurality of components, each respective component in the plurality of components being mounted with a respective component connector. The prototyping apparatus includes a housing, the microcontroller being within the housing, a user interface on an exterior surface of the housing for interaction between a user and the microcontroller, and a first housing connector having a first plurality of pins for accepting the respective component connector of a first one of the components in the plurality of components. The housing has a first slot therein exposing the first housing connector. The microcontroller presents via the user interface a first plurality of configuration choices for the first plurality of pins. The microcontroller accepts via the user interface user selections from among the first plurality of choices.

The housing may further include a second housing connector having a second plurality of pins for accepting the respective component connector of a second one of the components in the plurality of components, in which case the housing has a second slot therein exposing the second housing connector, the microcontroller presents via the user interface a second plurality of configuration choices for the second plurality of pins, and the microcontroller accepts via the user interface user selections from among the second plurality of choices.

A method of operating such a prototyping system may include repeating, for a respective plurality of pins in each respective housing connector in which a respective component connector is accepted, (a) presenting, by the microcontroller, via the user interface, a respective plurality of configuration choices for the respective plurality of pins, and (b) accepting, by the microcontroller, via the user interface, user selections from among the respective plurality of choices, where the repeating continues until each housing connector is configured.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

To facilitate prototyping of systems using small components in conjunction with a microcontroller, a prototyping apparatus, including a microcontroller and a user interface, as well as input/output terminals, may be provided. Among the input/output terminals may be a set of terminals that can accept the pins of a breakout board or similar structure bearing the component. Software accessible via the user interface can be used to configure terminals in the set of terminals to match the functions of the pins that are plugged into those terminals.

As partly noted above, the small components may include sensors, motors and servos, as well as indicators such as lights (including light-emitting diodes) or other optical transducers, or aural transducers (speakers, buzzers, etc.), or other hardware components. A common format for such components is a breakout board, which is a small printed circuit board that contains one or more smaller components connected to a set of pins.

Figure 1:
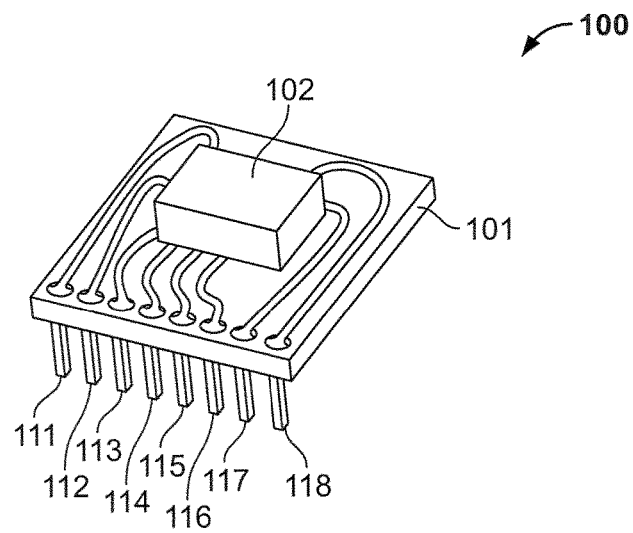
FIG. 1 is a representation of a typical breakout board.

Although the breakout boards may contain various numbers of pins in different configurations, for the purpose of this disclosure, a breakout board may be considered to have up to eight pins, aligned in a row. A typical breakout board 100, including circuit board 101, component 102 and eight pins 111-118, is shown in FIG. 1. A standard arrangement includes a row of pins having a 0.1-inch pitch or spacing. However, for any particular breakout board 100, functions or signals can be assigned to pins 111-118 in an arbitrary configuration or order relative to any other breakout board. As noted, even the numbers of pins may be different. And if the mating pins on a prototyping device were to be assigned by default to particular functions or signals, it is unlikely that those functions or signals would match the functions or signals assigned to the pins of the breakout board.

In accordance with implementations of subject matter described in this disclosure, a prototyping device may be provided with one or more sets of terminals that can accept the pins of a breakout board. The prototyping device includes a processor or microcontroller unit for interacting with the component on the breakout board. That same processor or microcontroller unit, or another, separate processor, may be used to present a utility to a user, via the user interface of the prototyping device, to assign to each terminal on the prototyping device the appropriate function that matches the function of the pin that mates to that terminal.

Figure 2:
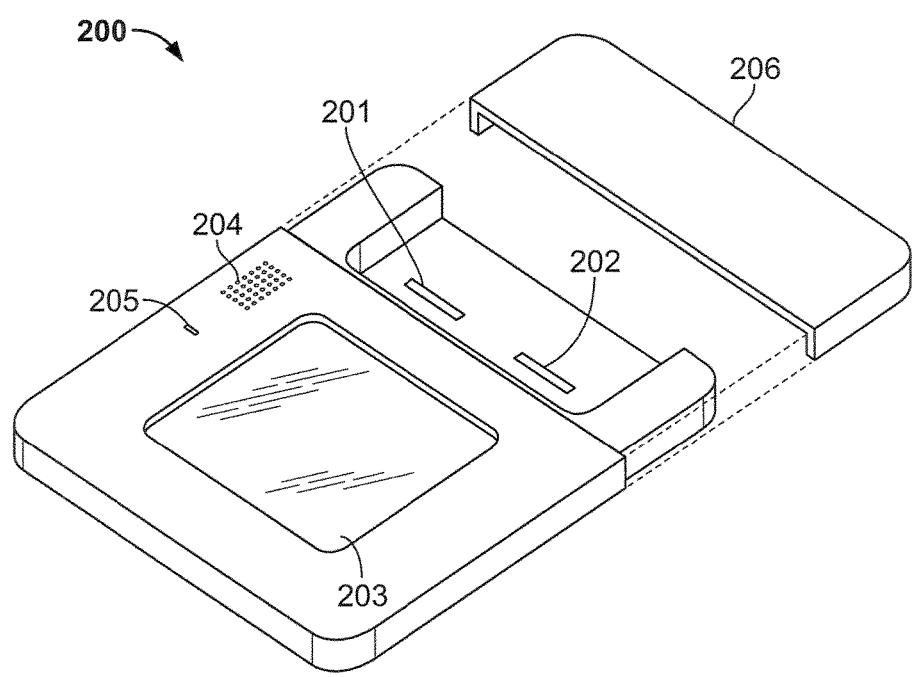
FIG. 2 shows an example of a prototyping device according to an implementation described in this disclosure.

One example of such a prototyping device 200 according to an implementation of subject matter described in this disclosure is shown in FIG. 2. As seen in FIG. 2, prototyping device 200 includes a housing having two slots 201, 202 in its exterior surface, each of which can accept a breakout board. In this example, each slot 201, 202 reveals a connector that can accept up to eight pins. Prototyping device 200 also has a microprocessor or microcontroller internal to the housing of device 200 (and therefore not visible in FIG. 2), and a touchscreen input/output display 203, a speaker 204 and a microphone 205.

Other terminals and controls may be present on other surfaces of the housing of prototyping device 200 not seen in FIG. 2. For example, there may be a power switch, as well as volume controls for speaker 204 and/or microphone 205, and brightness and/or contrast controls for touchscreen input/output display 203. Other terminals may include a power supply input, as well as terminals for connection to a larger device (e.g., a personal computer) or to a communications network (e.g., the Internet). In some implementations, the terminals in one or more of slots 201, 202 may be replicated or duplicated on another surface of the housing of prototyping device 200—e.g., as part of a larger group of terminals including the other terminals described above. Cover 206 may be provided to enclose any breakout boards that are inserted in slots 201, 202 to prevent damage to, or dislodging of, the breakout boards, and to give a finished appearance to the prototype being implemented.

The microcontroller may be any suitable microcontroller. Some examples of suitable microcontrollers include a microcontroller from the PIC16 family of PIC® microcontrollers available from Microchip Technology Inc., of Chandler, Ariz., an ARW-based microprocessor licensed from ARM Holdings plc, of Cambridge, England, or a microcontroller based on the Arduino® open-source architecture, among others. In addition to being able to run the pin-assignment utility described below, if the same microcontroller is used to interact with the component on the breakout board, the microcontroller is able to simulate or emulate the various data exchange protocols that might be used by a component, including digital and analog protocols. One example is the Inter-Integrated Circuit protocol (also known as $I^2C$, I2C or IIC).

A pin-assignment utility in accordance with implementations of subject matter described in this disclosure may be launched by a user from a menu (not shown) on touchscreen input/output display 203, or may launch automatically upon detection of insertion of a connector into one of slots 201, 202. If the pin-assignment utility is launched by detection of insertion of a connector into one of slots 201, 202, then the utility will "know" which slot is to be configured. However, if the pin-assignment utility is launched by the user, or even if the pin-assignment utility is launched by detection of insertion of a connector but a connector is inserted in each of slots 201, 202, the user may be prompted to indicate which of the two slots 201, 202 is to be configured.

Figure 3:
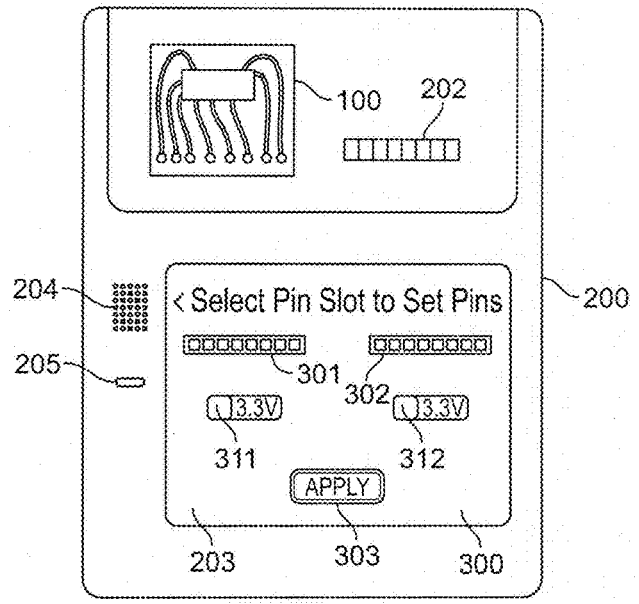
FIG. 3 shows an example in which a connector of a breakout board has been inserted into a prototyping device.

In the example shown in FIG. 3, where the connector of one breakout board 100 has been inserted into slot 201, the user may be presented with a graphical interface 300 on touchscreen input/output display 203, including graphic representations 301, 302 of the two slots 201, 202, and may select the correct one of slots 201, 202 by pressing or touching (e.g., with a finger or with a tool such as a stylus) the corresponding one of representations 301, 302. However, other selection mechanisms may be provided. As just one additional example, the user may be asked to press or touch a "radio button" next to one of two labels (not shown) indicating the two slots 201, 202 (e.g., "left slot" and "right slot").

Figure 4:
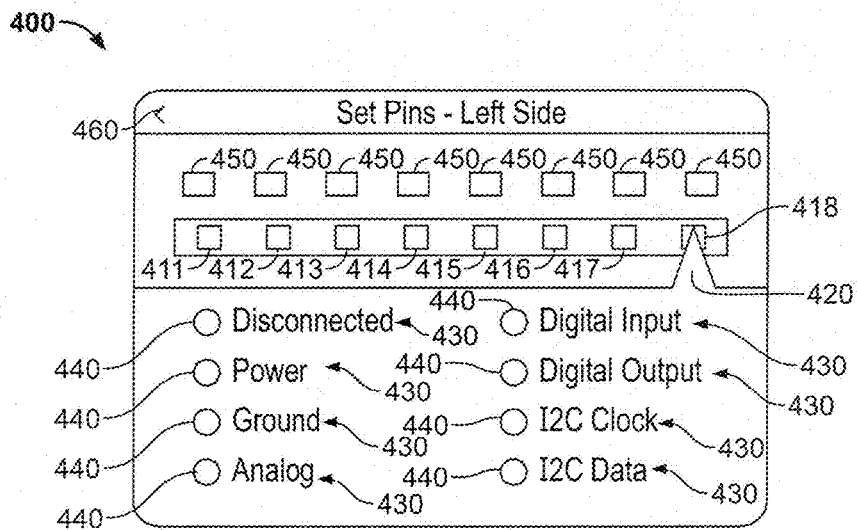
FIG. 4 is an example of an interface display according to an implementation described in this disclosure.

Once the correct slot has been selected—whether by user selection or by detection of the connector of the breakout board, the user will be presented with a graphical interface 400 on touchscreen input/output display 203, which may have the appearance shown in FIG. 4. Although other display configurations are possible, as shown in FIG. 4 interface display 400 includes a row 410 of square areas 411-418, each of which represents one of the terminals in the respective one of slots 201, 202 that is being configured. The user may select one of square areas 411-418 by pressing or touching, and that one of square areas 411-418 will then be indicated by an arrow such as arrow 420.

Beneath row 410 is a list of possible functions, including "Disconnected" (i.e., the terminal is null or not used), "Power", "Ground", "Analog", "Digital Input", "Digital Output", "I2C Clock", "I2C Data", etc. The user can select a function for the terminal position indicated by arrow 420 by pressing or touching the corresponding label 430 for the desired function or, as shown in FIG. 4, by pressing or touching the corresponding radio button 440 next to the label 430 for the desired function. When a selection has been made, a tag 450 above the corresponding one of square areas 411-418 will change to display text indicating the selected function. Once the desired functions have been assigned to all terminals 411-418, the user can indicate that the assignment process for that one of slots 201, 202 is complete by pressing or touching an appropriate indication. In this example, the user may press or touch the left arrow 460 at the upper left corner of touchscreen input/output display 203.

The foregoing process may be repeated until terminals in all slots (e.g., both slots 201, 202) have been assigned.

As a further option, the pin assignment utility also may present to the user an option to designate, for each slot 201, 202, the voltage level to be used by that slot. For example, as shown in FIG. 3, under the respective representation 301, 302 of each slot 201, 202, there is a respective check-box 311, 312 to select a voltage of 3.3V for that slot. If the box is not checked, then 5V would be used. Alternatively, the user could be presented with a list of possible voltages for each slot, and would be required to select a voltage, by, e.g., selecting a radio button next to the correct voltage. According to that option, in the foregoing example, both 3.3V and 5V would be presented. In some cases, more than two choices of voltage may be presented. For example, 1.8V is another voltage, besides 3.3V and 5V, that might be included.

Once the pin assignments (and voltage selections, if available) have been completed, which the user may indicate by pressing or touching button 303 (labelled "Apply" in this example), the microcontroller (either the same microcontroller that executed the pin assignment process, or a separate microcontroller, as discussed above) can interface with the component according to user software running on the microcontroller to perform whatever function the device being prototyped is intended to perform, using the programmed pin assignments. With the breakout board or boards securely inserted in slots 201, 202, the prototype could be safely transported for testing without concern for dislodged jumper wires, etc.

Figure 5:
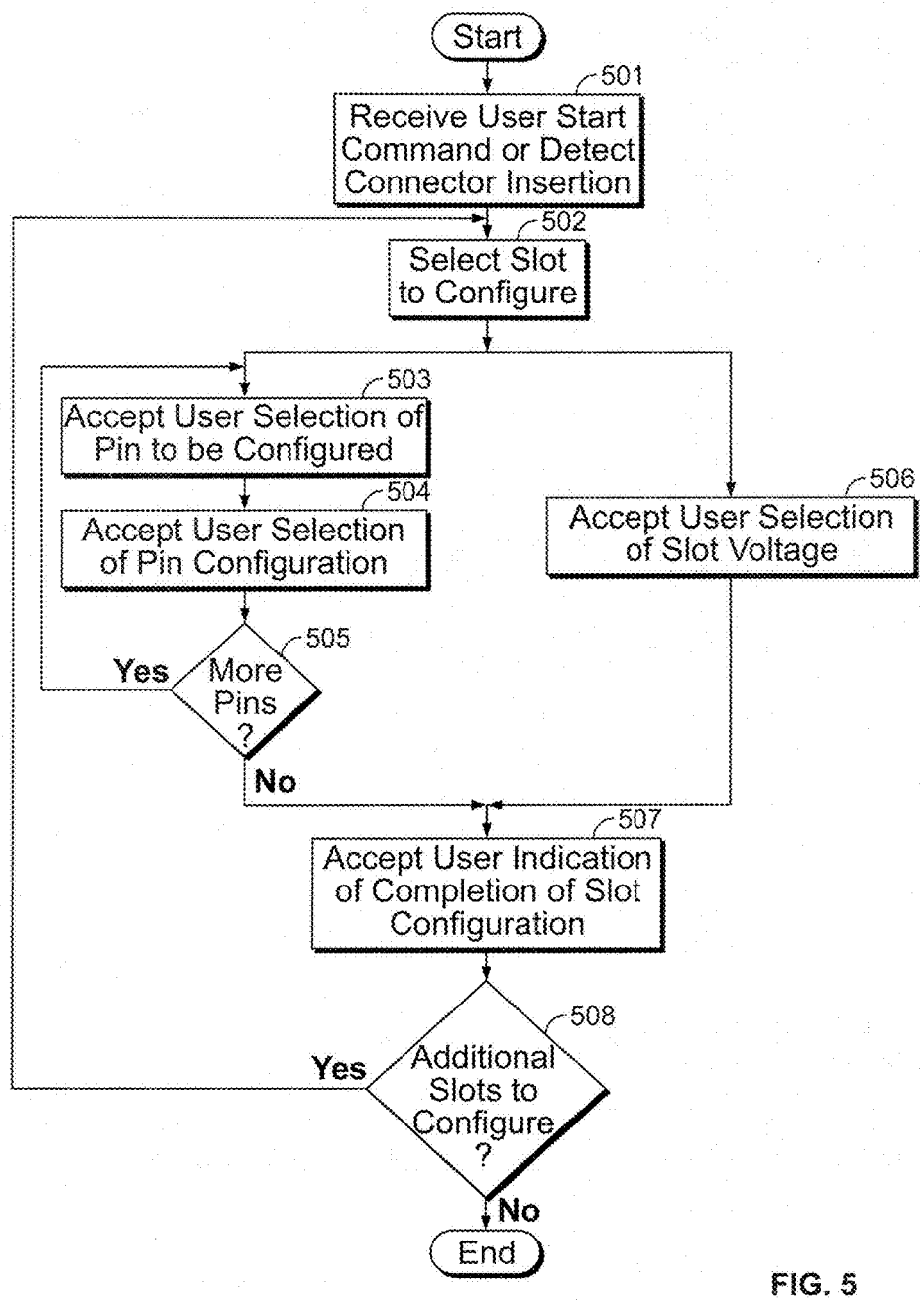
FIG. 5 is a flow diagram of a method according to an implementation described in this disclosure.

The pin assignment utility described above may operate in accordance with the method 500 diagrammed in FIG. 5.

Method 500 begins at 501, either by receipt of user command to begin, or by detection of insertion of a connector into one or both of slots 201, 202. At 502, the slot to be configured is selected, either by user input or automatically based on only one slot having a connector inserted.

At 503, the user selects a pin to be configured, and at 504 the user enters the configuration for that pin. At 505, it is determined (e.g., based on user input) whether there are more pins to be configured in the currently selected slot. If so, method 500 returns to 503. If there are no more pins to be configured, method 500 continues to 507. Meanwhile, at 506, in parallel with 503-505, the user inputs the voltage level to be used by the slot being configured—either affirmatively or by leaving the default choice in place.

At 507, a user entry indicating completion of configuration of the selected slot is detected. At 508, it is determined, based on user input, whether or not an additional slot is to be configured. If not, method 500 ends. If at 508 another slot is to be configured, method 500 returns to the beginning of the parallel paths through 503-505 on the one hand, and 506 on the other hand, until all slots have been configured.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A prototyping apparatus comprising:
a housing;
a microcontroller within the housing;
a user interface on an exterior surface of the housing for interaction between a user and the microcontroller;
a first connector having a first plurality of pins for accepting a first external component; and
a second connector having a second plurality of pins for accepting a second external component; wherein:
the housing has a first slot therein exposing the first connector and a second slot therein exposing the second connector;
the microcontroller presents via the user interface a first plurality of configuration choices, including choices of individual function signal assignments for individual pins in the first plurality of pins, and a second plurality of configuration choices, including choices of individual function signal assignments for individual pins in the second plurality of pins;
the microcontroller accepts via the user interface user selections of individual function signal assignments for individual pins in the first plurality of pins from among the first plurality of configuration choices, and user selections of individual function signal assignments for individual pins in the second plurality of pins from among the second plurality of configuration choices;
the first one of the components is operable, with the microcontroller, according to the individual function signal assignments for the individual pins in the first plurality of pins; and
the second one of the components is operable, with the microcontroller and the first one of the components, according to the individual function signal assignments for the individual pins in the second plurality of pins.

2. The prototyping apparatus of claim 1 wherein at least one of the first and second pluralities of configuration choices comprises a voltage.

3. The prototyping apparatus of claim 1 further comprising additional connector pins; wherein:
the additional connector pins include duplicates of at least one respective one of the first and second pluralities of pins at at least one respective location separate from the first connector and the second connector.

4. A prototyping system for prototyping of devices, where each device to be prototyped includes a microcontroller and a component, the prototyping system comprising:
a plurality of components, each respective component in the plurality of components being mounted with a respective component connector; and
prototyping apparatus including:
a housing, the microcontroller being within the housing,
a user interface on an exterior surface of the housing for interaction between a user and the microcontroller,
a first housing connector having a first plurality of pins for accepting the respective component connector of a first one of the components in the plurality of components, and
a second housing connector having a second plurality of pins for accepting the respective component connector of a second one of the components in the plurality of components; wherein:
the housing has a first slot therein exposing the first housing connector and a second slot therein exposing the second housing connector;
the microcontroller presents via the user interface a first plurality of configuration choices, including choices of individual function signal assignments for individual pins in the first plurality of pins, and a second plurality of configuration choices, including choices of individual function signal assignments for individual pins in the second plurality of pins;

the microcontroller accepts via the user interface user selections of individual function signal assignments for individual pins in the first plurality of pins from among the first plurality of configuration choices, user selections of individual function signal assignments for individual pins in the second plurality of pins from among the second plurality of configuration choices;

the first one of the components operates, with the microcontroller, according to the individual function signal assignments for the individual pins in the first plurality of pins; and the second one of the components operates, with the microcontroller, according to the individual function signal assignments for the individual pins in the second plurality of pins.

5. The prototyping system of claim 4 wherein at least one of the first and second pluralities of configuration choices comprises a voltage.

6. The prototyping system of claim 4 wherein:
the housing further comprises additional connector pins; and
the additional connector pins include duplicates of at least one respective one of the first and second pluralities of pins at at least one respective location separate from the first connector and the second connector.

7. The prototyping system of claim 4 wherein each respective component in the plurality of components and its respective component connector are mounted on a respective breakout board.

8. A method of operating a prototyping apparatus to prototype devices that include a microcontroller and at least one component from among a plurality of components, wherein each respective component in the plurality of components is mounted with a respective component connector, and the prototyping apparatus includes a housing, a microcontroller within the housing, a user interface on an exterior surface of the housing for interaction between a user and the microcontroller, a first housing connector having a first plurality of pins for accepting the respective component connector of a first one of the components in the plurality of components, and a second housing connector having a second plurality of pins for accepting the respective component connector of a second one of the components in the plurality of components, the method comprising:

presenting, by the microcontroller, via the user interface, a first plurality of configuration choices including choices of individual function signal assignments for individual pins in the first plurality of pins, and a second plurality of configuration choices including choices of individual function signal assignments for individual pins in the second plurality of pins;

accepting, by the microcontroller, via the user interface, user selections of individual function signal assignments for individual pins in the first plurality of pins from among the first plurality of configuration choices, and user selections of individual function signal assignments for individual pins in the second plurality of pins from among the second plurality of configuration choices;

operating the first one of the components, with the microcontroller, according to the individual function signal assignments for the individual pins in the first plurality of pins; and operating the second one of the components, with the microcontroller, according to the individual function signal assignments for the individual pins in the second plurality of pins.

9. The method of claim 8 wherein at least one of the first and second pluralities of configuration choices comprises a voltage.

10. The method of claim 8 further comprising:
prior to the presenting of the first plurality of configuration choices and prior to the presenting of the second plurality of configuration choices, detecting presence of a component connector at one of the first or second housing connector;

based on the detecting the presence of a component connector at the first housing connector, initiating the presenting of the first plurality of configuration choices for the first plurality of pins; and based on the detecting the presence of a component connector at the second housing connector, initiating the presenting of the second plurality of configuration choices for the second plurality of pins.

11. The method of claim 8 further comprising:
prior to the presenting of the first plurality of configuration choices and prior to the presenting of the second plurality of configuration choices, receiving user input indicating presence of a component connector at one of the first or second housing connector;

based on the user input indicating the presence of a component connector at the first housing connector, initiating the presenting of the first plurality of configuration choices for the first plurality of pins; and based on the user input indicating the presence of a component connector at the second housing connector, initiating the presenting of the second plurality of configuration choices for the second plurality of pins.

* * * * *